US009355937B2

(12) United States Patent
Koyama

(10) Patent No.: US 9,355,937 B2
(45) Date of Patent: May 31, 2016

(54) SEMICONDUCTOR DEVICE

(71) Applicant: Mitsubishi Electric Corporation, Tokyo (JP)

(72) Inventor: Hidetoshi Koyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 29 days.

(21) Appl. No.: 14/465,884

(22) Filed: Aug. 22, 2014

(65) Prior Publication Data

US 2015/0155224 A1 Jun. 4, 2015

(30) Foreign Application Priority Data

Nov. 29, 2013 (JP) .................................. 2013-247862

(51) Int. Cl.
*H01L 23/482* (2006.01)
*H01L 23/48* (2006.01)
*H01L 23/00* (2006.01)

(52) U.S. Cl.
CPC .......... *H01L 23/4827* (2013.01); *H01L 23/481* (2013.01); *H01L 24/05* (2013.01); *H01L 24/03* (2013.01); *H01L 24/29* (2013.01); *H01L 2224/039* (2013.01); *H01L 2224/0345* (2013.01); *H01L 2224/0361* (2013.01); *H01L 2224/03462* (2013.01); *H01L 2224/03464* (2013.01); *H01L 2224/04026* (2013.01); *H01L 2224/05005* (2013.01); *H01L 2224/0508* (2013.01);

(Continued)

(58) Field of Classification Search
CPC ... H01L 23/4827; H01L 24/05; H01L 23/481; H01L 2224/29022; H01L 2224/291; H01L 2224/05116; H01L 2224/0345; H01L 2224/05561; H01L 2224/05644; H01L 2224/05144; H01L 2224/0508; H01L 2224/05124
See application file for complete search history.

(56) References Cited

U.S. PATENT DOCUMENTS 8,581,360 B2 * 11/2013 Chen .............................. 257/471
2001/0028113 A1 * 10/2001 Kosaki et al. .................. 257/758

(Continued)

FOREIGN PATENT DOCUMENTS

JP 7-66384 A 3/1995
JP 10-303198 A 11/1998

(Continued)

OTHER PUBLICATIONS

Machine translation of JP 2007-095853A.*
Machine translation of JP 1995-066384A.*
Korean Patent Office; Office Action in Korean Patent Application No. 10-2014-0164164 (Sep. 1, 2015).

Primary Examiner — Michelle Mandala
(74) Attorney, Agent, or Firm — Leydig, Voit & Mayer, Ltd.

(57) ABSTRACT

A semiconductor device includes a semiconductor substrate, a first metal layer, a barrier metal layer, and a second metal layer. The semiconductor substrate includes a front surface and a back surface. A semiconductor element and an electrode of the semiconductor element are located on the front surface. An opening in the back surface reaches a lower surface of the electrode, and the opening is defined by a side surface and a bottom surface. The first metal layer covers the side surface and the bottom surface. The barrier metal layer covers the first metal layer in the opening. The second metal layer is in contact with solder in the opening and is closer to the electrode than parts of the barrier metal layer. The second metal layer is laminated on the barrier metal layer and covers at least a part of the barrier metal layer in the opening.

11 Claims, 4 Drawing Sheets

(52) U.S. Cl.
CPC ............... *H01L2224/05082* (2013.01); *H01L 2224/05083* (2013.01); *H01L 2224/05084* (2013.01); *H01L 2224/05116* (2013.01); *H01L 2224/05124* (2013.01); *H01L 2224/05144* (2013.01); *H01L 2224/05147* (2013.01); *H01L 2224/05155* (2013.01); *H01L 2224/05157* (2013.01); *H01L 2224/05166* (2013.01); *H01L 2224/05169* (2013.01); *H01L 2224/05179* (2013.01); *H01L 2224/05187* (2013.01); *H01L 2224/05561* (2013.01); *H01L 2224/05564* (2013.01); *H01L 2224/05644* (2013.01); *H01L 2224/291* (2013.01); *H01L 2224/29022* (2013.01); *H01L 2224/29144* (2013.01)

(56) References Cited

U.S. PATENT DOCUMENTS

| 2003/0025173 | A1* | 2/2003 | Suminoe et al. | 257/459 |
| 2003/0203210 | A1* | 10/2003 | Graff et al. | 428/412 |
| 2012/0052641 | A1* | 3/2012 | Lee et al. | 438/270 |
| 2013/0154096 | A1* | 6/2013 | Tanaka | 257/751 |

FOREIGN PATENT DOCUMENTS

| JP | 2003-45877 A | 2/2003 |
| JP | 2007-95853 A | 4/2007 |

* cited by examiner

SEMICONDUCTOR DEVICE

BACKGROUND OF THE INVENTION

1. Field of the Invention

The present invention relates to a semiconductor device.

2. Background Art

As disclosed in Japanese Patent Laid-Open No. 10-303198, for example, a semiconductor device in which a Via Hole penetrating a semiconductor substrate from a back surface side and reaching an electrode pad on a front surface is provided, and a solder is provided in this Via Hole has been known. In the semiconductor device according to this gazette, an electrode of a semiconductor element is provided on the front surface of the semiconductor substrate, and an opening reaching a lower surface of the electrode is provided on the back surface of the semiconductor substrate. After an Au film and a Ni film are sequentially laminated in this opening, the semiconductor substrate and a package substrate are bonded by using an AuSn solder.

Other prior art includes Japanese Patent Laid-Open No. 7-066384 and Japanese Patent Laid-Open No. 2007-095853.

Nickel has a property of repelling a solder. Thus, there is a concern that a region in which air remains in the solder is generated due to deterioration of close contact between the Ni film and the solder in the semiconductor device according to the above prior-art technology. This region in which air remains in the solder is also referred to as a void.

The solder in the Via Hole also has a role of diffusing heat generated when the semiconductor element is operating. If there is a void in the solder, such diffusion of heat is prevented. As a result, radiation through the solder is not performed, heat is accumulated in the semiconductor element, and characteristics of the semiconductor element deteriorate.

SUMMARY OF THE INVENTION

The present invention was made in order to solve the above described problem and has an object to provide a semiconductor device which can suppress occurrence of a void when a solder is provided in the Via Hole.

According to one aspect of the present invention, a semiconductor device includes a semiconductor substrate, a first metal layer, a barrier metal layer, and a second metal layer. The semiconductor substrate includes a front surface and a back surface. A semiconductor element and an electrode of the semiconductor element are provided on the front surface. An opening is provided on the back surface and reaching a lower surface of the electrode, and the opening includes a side surface and a bottom surface. The first metal layer covers the side surface and the bottom surface. The barrier metal layer covers the first metal layer in the opening The second metal layer is in close contact with the solder higher than the barrier metal layer. The second metal layer is laminated on the barrier metal layer and covers at least a part of the barrier metal layer in the opening Other and further objects, features and advantages of the invention will appear more fully from the following description.

BRIEF DESCRIPTION OF THE DRAWINGS

FIG. 11 is a sectional view illustrating a semiconductor device according to a comparative example with respect to the embodiment; and FIG. 12 is a sectional view illustrating a semiconductor device according to a comparative example with respect to the embodiment.

DETAILED DESCRIPTION OF THE PREFERRED EMBODIMENTS

Figure 1:
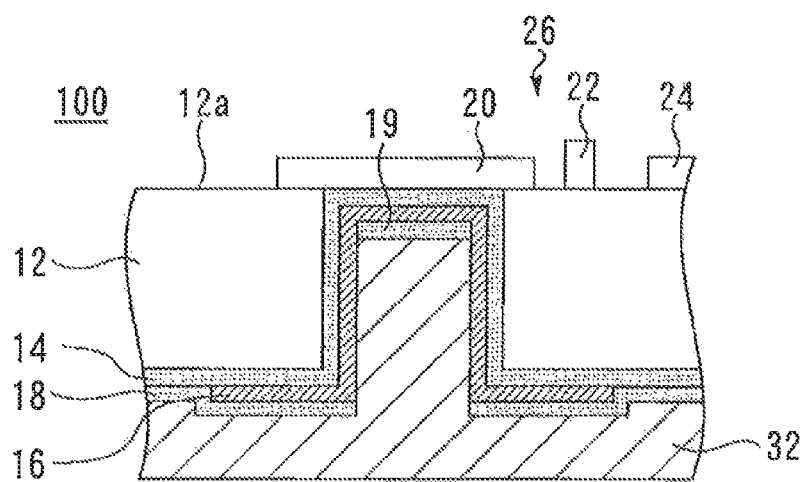
FIG. 1 is a sectional view illustrating a semiconductor device according to an embodiment of the present invention.

FIG. 1 is a sectional view illustrating a semiconductor device 100 according to an embodiment of the present invention. FIGS. 2 to 5 are sectional views illustrating a manufacturing process of the semiconductor device according to the embodiment of the present invention. The semiconductor device 100 includes a semiconductor substrate 12 on which a transistor 26 is formed, a Via Hole 30, an Au layer 18 provided on a back surface 12*b* of the semiconductor substrate 12, and a solder layer 32 filled in the Via Hole 30.

The Via Hole 30 has an Au layer 14, a Ni layer 16, and an Au layer 19 provided in an opening 12*d* of the semiconductor substrate 12. The Ni layer 16 is a barrier metal layer for barriering an AuSn reaction between the solder and the Au layer 14 as will be described layer.

A semiconductor element provided in the semiconductor device 100 according to the embodiment is a transistor 26. The transistor 26 is a field effect transistor (FET), a gate, a source, and a drain are juxtaposed in this order and provided on a front surface 12*a* of the semiconductor substrate 12, and a source electrode 20 is provided on the source, a gate electrode 22 on the gate, and a drain electrode 24 on the drain, respectively. The present invention is not limited to FET but can be applied to known semiconductor elements to be formed on the semiconductor substrate.

Figure 2:
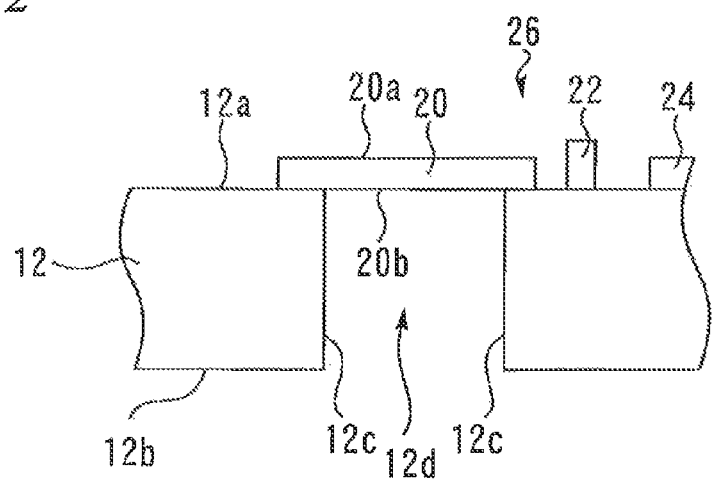
FIG. 2 is a sectional view illustrating a manufacturing process of the semiconductor device according to the embodiment of the present invention.

As illustrated in FIG. 2, the semiconductor substrate 12 includes the front surface 12*a* and the back surface 12*b*. On the front surface 12*a*, the source electrode 20, the gate electrode 22, and the drain electrode 24 of the transistor 26 are provided. The source electrode 20 has an upper surface 20*a* and a lower surface 20*b*. An opening 12*d* reaching the lower surface 20*b* is provided on the back surface 12*b*. The Au layer 14 covers a side surface 12*c* and a bottom surface of the opening 12d. It should be noted that the bottom surface of the opening 12d is the lower surface 20b.

The Ni layer 16 is provided so as to cover the entire Au layer 14 in the opening 12d. The Ni layer 16 has a property of repelling a solder and functions as a barrier metal with respect to the solder. Even if the AuSn reaction occurs between the Au layers 18 and 19 and the solder layer 32, the Ni layer 16 functions as a barrier metal, and thus, the AuSn reaction stops. Therefore, the solder can be prevented from crawling up to the source electrode 20 of the transistor 26.

In this embodiment, though the Ni layer 16 is provided to an edge portion of the opening 12d in the back surface 12b from the inside of the opening 12d, it is not provided outside of the edge portion of the opening 12d. In the semiconductor substrate 12, the irregularity of the back surface 12b is less than that of the front surface 12a on which the transistor 26 is provided. By partially providing the Ni layer 16 on the back surface 12b with less irregularity rather than the front surface 12a, a smaller amount of the Ni layer is provided on a smooth surface so as to reduce a stress. As described above, a position and a range where the Ni layer 16 is provided is improved, separation of the Ni layer 16 can be suppressed.

Figure 5:
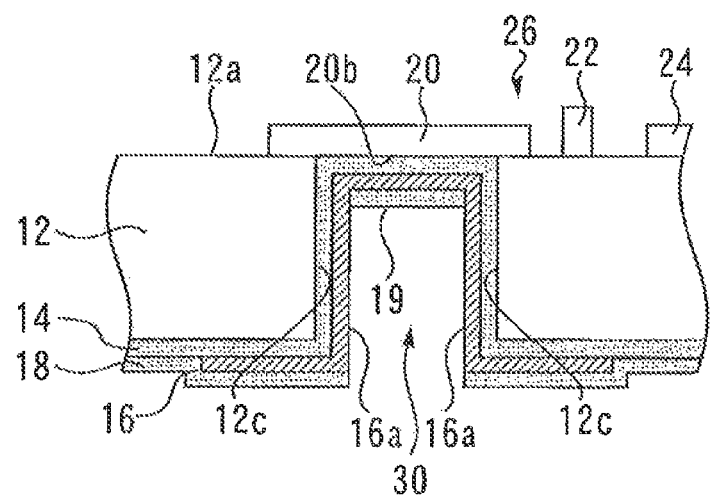
FIG. 5 is a sectional view illustrating a manufacturing process of the semiconductor device according to the embodiment of the present invention.

As illustrated in FIG. 5, the Au layer 19 is laminated on the Ni layer 16 so as to cover a part of the Ni layer 16 in the opening 12d. Au is in close contact with the solder higher than Ni. In this embodiment, the Au layer 19 covers a portion in the Ni layer 16 overlapped with the bottom surface of the opening 12d, and the Au layer 19 exposes a portion in the Ni layer 16 overlapped with the side surface 12c. As a result, the Ni layer 16 has an exposed portion 16a. This exposed portion 16a constitutes a side surface of the Via Hole 30. It is not necessary to expose all the portions in the Ni layer 16 overlapped with the side surface 12c, and only a part of the portion in the Ni layer 16 overlapped with the side surface 12c may be exposed.

The solder layer 32 is provided so as to fill the inside of the opening 12d and is in contact with a part of the Ni layer 16 and the Au layer 19. The semiconductor substrate 12 on which the semiconductor device 100 is formed is subjected to dicing and is separated into a semiconductor chip. The solder layer 32 is interposed between the semiconductor chip and a package substrate (not shown) or the like when the semiconductor chip is die-bonded to the package substrate or the like. Since close contact of the solder in the Via Hole 30 is ensured due to presence of the Au layer 19, the solder is made to be filled to each corner in the Via Hole 30 so as to suppress occurrence of a void.

Moreover, the Ni layer 16 is present one layer below the Au layer 19, and the Ni layer 16 has the exposed portion 16a in the Via Hole 30. The Ni layer 16 serves as a barrier metal with respect to the solder and can prevent crawling-up of the solder to the source electrode 20 of the transistor 26.

As described above, by partially providing the Au layer 19 on the Ni layer 16 in the Via Hole 30, close contact of the solder is improved while a reaction between the Au layer 14 and the solder is prevented and thus, occurrence of a void in the Via Hole 30 can be suppressed.

[Method for Manufacturing According to Embodiment]

As a method for forming metal used in the manufacturing process which will be described below with FIGS. 2 to 5, known metal lamination technologies such as electrolytic plating, non-electrolytic plating, deposition, sputtering and the like may be used as appropriate.

First, on the front surface 12a of the semiconductor substrate 12, the source, the drain, and the gate, not shown, are formed, and on top of them, the source electrode 20, the drain electrode 24, and the gate electrode 22 are further provided so as to form the transistor 26. After that, in order to form the Via Hole 30 immediately below the source electrode 20, the semiconductor substrate 12 is etched from the back surface 12b side. Thereby, the opening 12d is formed in the semiconductor substrate 12. As a result, the structure in FIG. 2 is obtained.

Figure 3:
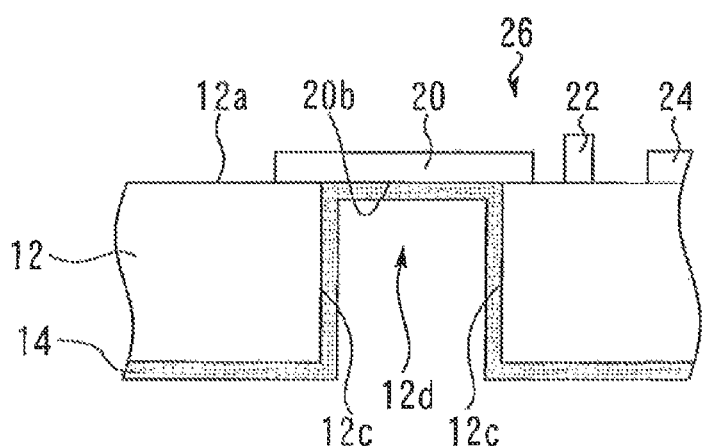
FIG. 3 is a sectional view illustrating a manufacturing process of the semiconductor device according to the embodiment of the present invention.

After the opening 12d is formed, the Au layer 14 is formed on the back surface 12b side so as to cover the entire back surface 12b including the opening 12d. As a result, the structure in FIG. 3 is obtained. The Au layer 14 covers the lower surface 20b of the source electrode 20, which is the bottom surface of the opening 12d, and the side surface 12c of the opening 12d. Instead of the Au layer 14, a Ti/Au layer or a Ti/Pt/Au layer may be laminated at the same position as the Au layer 14.

Figure 4:
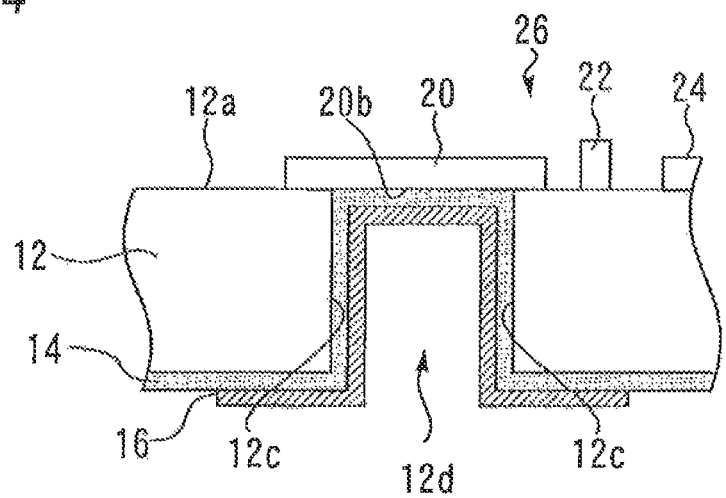
FIG. 4 is a sectional view illustrating a manufacturing process of the semiconductor device according to the embodiment of the present invention.

After that, the Ni layer 16 is laminated on the Au layer 14 on the back surface 12b side. Specifically, after Ni is laminated on the entire back surface 12b including the opening 12d, patterning is performed so that Ni remains only in the opening 12d and on an edge peripheral portion of this opening 12d. Ni in a portion other than this edge peripheral portion is removed by etching Thereby, the Ni layer 16 is formed. As a result, the structure in FIG. 4 is obtained.

Subsequently, the Au layers 18 and 19 are formed. The Au layer 18 is formed on the entire surface of the back surface 12b except for the inner surface of the opening 12d, and the Au layer 18 comes to the foremost surface side of the back surface 12b. On the other hand, the Au layer 19 is partially provided on the bottom surface side of the opening 12d. The Au layer 19 covers a part of the Ni layer 16 which is provided on the bottom surface of the opening 12d, while the Au layer 19 does not cover the other part of the Ni layer 16 which overlaps with the side surface 12c of the opening 12d. As a result, the structure in FIG. 5 is obtained. By using sputtering or a depositing device with strong anisotropy or the like to provide Au in a perpendicular direction to the bottom surface of the opening 12d, the Au layer 19 can be provided partially on the bottom surface side of the opening 12d without forming unnecessary Au layer on the side surface 12c side. Instead of the Au layers 18 and 19, a Ti/Au layer or a Ti/Pt/Au layer, for example, may be laminated at the same position as the Au layers 18 and 19.

Subsequently, die-bonding using the solder is performed. A package substrate or the like, which is a die-bonding destination, is not shown. By providing the solder on the entire back surface 12b so as to fill the Via Hole 30, the solder layer 32 is formed. As a result, the structure in FIG. 1 is obtained.

[Explanation of Comparative Example]

FIGS. 11 and 12 are sectional views illustrating a semiconductor device 200 according to a comparative example with respect to the embodiment. FIG. 11 is a sectional view of the semiconductor device 200 according to the comparative example, and a difference from the semiconductor device 100 according to the embodiment is that the comparative example is not provided with the Au layers 18 and 19. FIG. 12 illustrates a state in which a void 132 is generated around the Ni layer 16 in the solder layer 32 since close contact between the Ni layer 16 and the solder is poor when the semiconductor substrate 12 on which the semiconductor device 200 is formed is die-bonded by a solder.

As an electrically connecting method for source-grounding of the transistor, there are a method of wiring a source electrode and a method forming a Via Hole so as to be connected to the source electrode. If the Via Hole 30 is to be formed on the source electrode, Au is used as metal provided on an inner surface of the Via Hole 30 in general.

If the solder is brought into contact with the Au layer (inside the Via Hole 30 and the source electrode portion), an AuSn reaction occurs. After die-bonding, if the Au layer 14 inside of the Via Hole 30 is in contact with the solder, the AuSn reaction occurs. There is a problem that the solder crawls up to the surface of the source electrode due to this AuSn reaction. This crawling-up of the solder diffuses the AuSn reaction to the transistor region, and the transistor 26 no longer operates normally.

The semiconductor device 200 according to the comparative example has the Ni layer 16 formed which can barrier the reaction with the solder in the Via Hole 30 as a measure against this crawling-up. By means of the Ni layer 16, crawling-up of the solder can be prevented.

However, on the other hand, since the Ni layer 16 is not in close contact with the solder, there is a problem that a region in which air remains in the solder occurs. This region in which the air remains in the solder is also referred to as a void. The void 132 prevents diffusion of heat generated when the transistor 26 is operating, and as a result, characteristics of the transistor 26 deteriorate. Moreover, the presence of the void 132 lowers close contact between the solder and the semiconductor substrate 12 side, and separation might be induced.

In this point, according to the semiconductor device 100 according to the embodiment, in the Via Hole 30, the Au layer 19 is partially provided on the front surface 12a side portion of the Ni layer 16. Since the close contact of the solder is improved in the Au layer 19 in the Via Hole 30 while the reaction between the Au layer 14 and the solder in the Ni layer 16 is prevented, occurrence of a void in the Via Hole 30 can be suppressed.

In this embodiment, the Au layer 19 is partially provided only above the lower surface 20b of the source electrode 20 (that is, above the bottom surface of the Via Hole 30) constituting the bottom surface of the opening 12d. The phrase "above the lower surface 20b" means a normal direction of the lower surface 20b. On the other hand, since the Au layer 19 is not provided on the side surface of the Via Hole 30 (that is, on the side surface 12c of the opening 12d), the Ni layer 16 has the exposed portion 16a. However, the present invention is not limited to this. It is only necessary that the Au layer is provided at least at a part in the Via Hole 30, and the position is not necessarily limited to the bottom surface side of the opening 12d.

Figure 6:
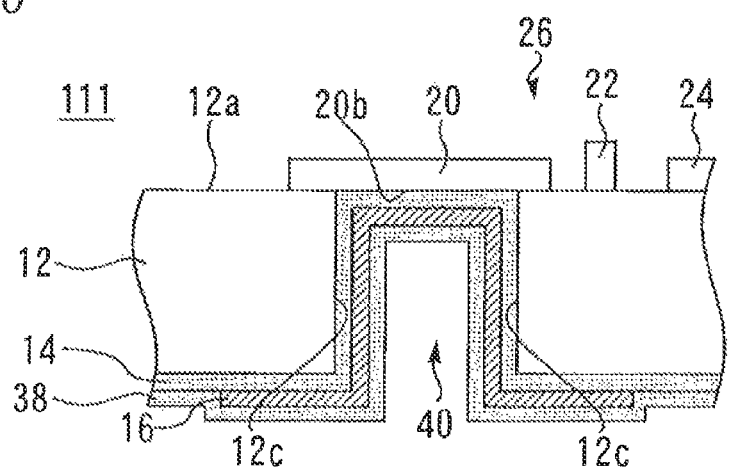
FIG. 6 is a sectional view illustrating a semiconductor device according to a variation of the embodiment of the present invention.

FIG. 6 is a sectional view illustrating a semiconductor device 111 according to a variation of the embodiment of the present invention. The semiconductor device 111 is the same as the semiconductor device 100 except that a Via Hole 40 is provided. The Via Hole 40 is provided with an Au layer 38 provided so as to cover the entire Ni layer 16 in the opening 12d. The Au layer 38 covers both above the lower surface 20b of the source electrode 20 constituting the bottom surface of the opening 12d and the side surface 12c of the opening 12d. That is, the Au layer 38 covers both above the bottom surface of the Via Hole 40 and the side surface of the Via Hole 40. By configuring as above, a portion where the Ni layer 16 is in contact with the solder layer 32 is eliminated, the solder can be filled to each corner in the Via Hole 40, and a void can be suppressed.

In the present embodiment, the Ni layer 16 is provided as a barrier metal layer, but the present invention is not limited to that. Instead of the Ni layer 16, a barrier metal layer formed of one material selected from a group consisting of platinum (Pt), lead (Pb), titanium (Ti), and cobalt (Co) may be provided at the same position as the Ni layer 16. That is because these materials have low reactivity with solder similarly to nickel.

Figure 7:
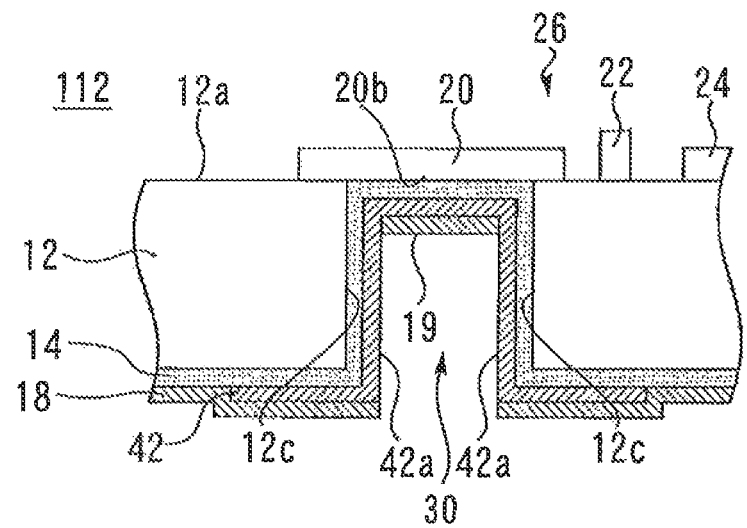
FIG. 7 is a sectional view illustrating a semiconductor device according to a variation of the embodiment of the present invention.

FIG. 7 is a sectional view illustrating a semiconductor device 112 according to a variation of the embodiment of the present invention. The semiconductor device 112 is the same as the semiconductor device 100 except that the Ni layer 16 is replaced by an oxidized Ni layer 42. That is, in the semiconductor device 112, the Au layer 19 covers a portion overlapped with the bottom surface in the oxidized Ni layer 42 and does not cover a portion overlapped with the side surface 12c in the oxidized Ni layer 42. As a result, the oxidized Ni layer 42 has an exposed portion 42a. This exposed portion 42a constitutes the side surface of the Via Hole 30 in the semiconductor device 112.

In general, as compared with the Au layer, Ni layer has higher metal stress. If the thickness of the Ni layer 16 is increased in order to improve barrier characteristics, the Ni layer 16 can easily separate from the semiconductor substrate 12. If the thickness of the Ni layer 16 is simply decreased in order to suppress this separation, the effect as the barrier metal layer is not sufficient. The Ni layer 16 and the solder also react though the speed of the reaction is extremely lower than that of the AuSn reaction and thus, the thickness of the Ni layer 16 cannot be simply decreased.

Oxidized nickel has a property of repelling a solder stronger than nickel. Thus, the film thickness of the oxidized Ni layer 42 can be decreased more than the Ni layer 16.

Thus, in the semiconductor device 112, the oxidized Ni layer 42 formed of oxidized nickel with higher barrier property is used as a barrier metal layer. Since the oxidized Ni layer 42 can repel a solder stronger than the Ni layer 16, even if the layer thickness of the barrier metal layer is made thinner, an effect of barriering the Au layer 14 from the solder can be sufficiently obtained. As a result, the oxidized Ni layer 42 is made thinner while the barrier metal is ensured, and the problem of separation can be suppressed.

As a manufacturing process of the semiconductor device 112, after the Ni layer is formed similarly to the Ni layer 16 according to the embodiment 1, the Ni layer is oxidized so as to have oxidized nickel (NiOx). After that, similarly to the embodiment 1, the Au layers 18 and 19 are laminated.

Instead of the oxidized Ni layer 42, an oxide layer of one material selected from a group consisting of platinum (Pt), lead (Pb), titanium (Ti), and cobalt (Co) may be provided.

Figure 8:
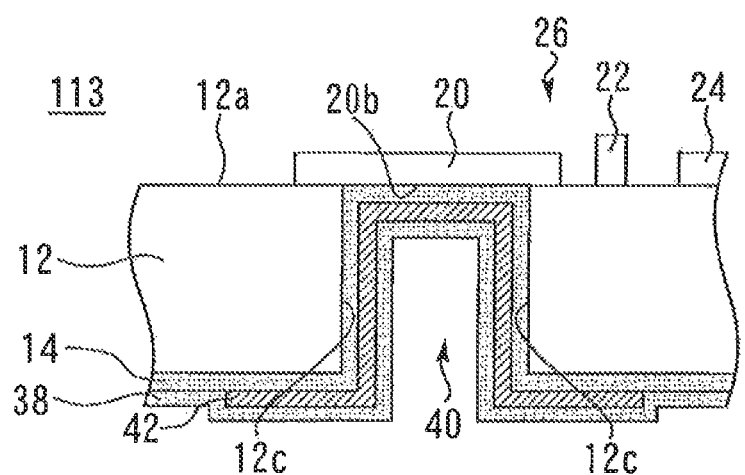
FIG. 8 is a sectional view illustrating a semiconductor device according to a variation of the embodiment of the present invention.

FIG. 8 is a sectional view illustrating a semiconductor device 113 according to a variation of the embodiment of the present invention. The semiconductor device 113 has the Ni layer 16 replaced by the oxidized Ni layer 42 in the semiconductor device 111 illustrated in FIG. 6.

Figure 9:
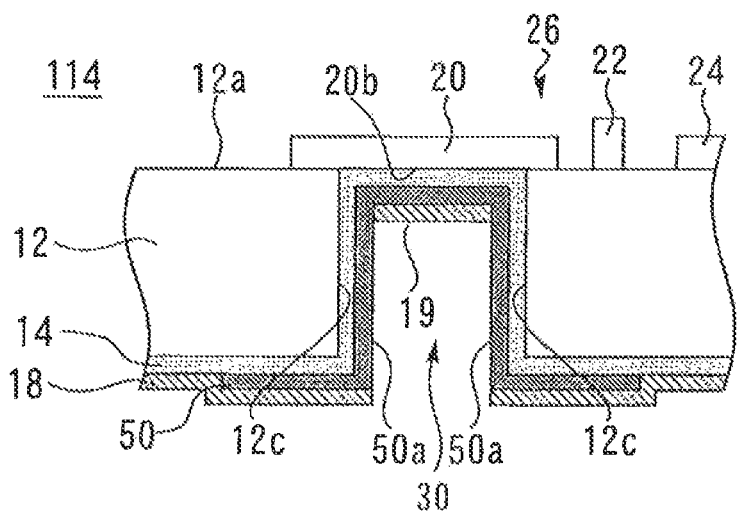
FIG. 9 is a sectional view illustrating a semiconductor device according to a variation of the embodiment of the present invention.

FIG. 9 is a sectional view illustrating a semiconductor device 114 according to a variation of the embodiment of the present invention. The semiconductor device 114 is the same as the semiconductor device 100 except that the Ni layer 16 is replaced by a barrier metal layer 50. The barrier metal layer 50 has a multi-layer film structure in which the Ni layer and an intermediate layer made of a material which will be described later other than Nickel are overlapped with each other and laminated at least once or more. In the barrier metal layer 50, the Ni layer is made thicker than the intermediate layer.

In the barrier metal layer 50, the Ni layer and the intermediate layer are overlapped with each other and laminated several times like "Ni layer/intermediate layer/Ni layer/intermediate layer/ . . . ", and thereby a multi-layer structure of the Ni layer and the intermediate layer can be provided. The material of the intermediate layer is a material with a stress in the layer lower than nickel, and specifically, one material selected from a group consisting of titanium (Ti), gold (Au), platinum (Pt), aluminum (Al), niobium (Nb), lead (Pb), and copper (Cu) may be used.

By having the multi-layer structure, each of the Ni layers is made thinner, and the intermediate layer made of metal with a stress lower than the nickel is sandwiched between the Ni layers. As a result, though the total thickness of the Ni layer between the barrier metal layer 50 and the Ni layer 16 of the embodiment 1 is the same, the internal stress can be reduced more in the barrier metal layer 50 than in the Ni layer 16.

For example, assume that the Ni layer 16 in the semiconductor device 100 is a single layer at 100 nm. On the other hand, in the semiconductor device 114, 5 layers of the Ni layers and 4 layers of the intermediate layers with one Ni layer at 20 nm and one intermediate layer at 10 nm such that the Ni layer/intermediate layer/Ni layer/intermediate layer/Ni layer/intermediate layer/Ni layer/intermediate layer/Ni layer. Though the barrier metal layer 50 has one layer of the Ni layer at 20 nm, there are 5 layers in total, and the Ni layer has a thickness of 100 nm equal to the Ni layer 16 as a total thickness. As described above, it is preferable that the internal stress is reduced while the thickness of the Ni layer is sufficiently ensured, and the barrier property with respect to the solder is made equal.

In the semiconductor device 114, the Au layer 19 covers the portion of the barrier metal layer 50 overlapped with the bottom surface of the opening 12*d* and does not cover the portion of the barrier metal layer 50 overlapped with the side surface 12*c*. As a result, the barrier metal layer 50 has an exposed portion 50*a*. This exposed portion 50*a* constitutes the side surface of the Via Hole 30.

Figure 10:
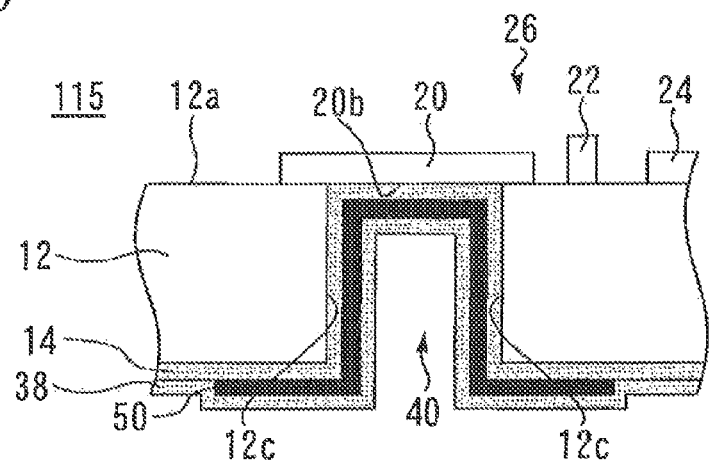
FIG. 10 is a sectional view illustrating a semiconductor device according to a variation of the embodiment of the present invention.
Figure 10:
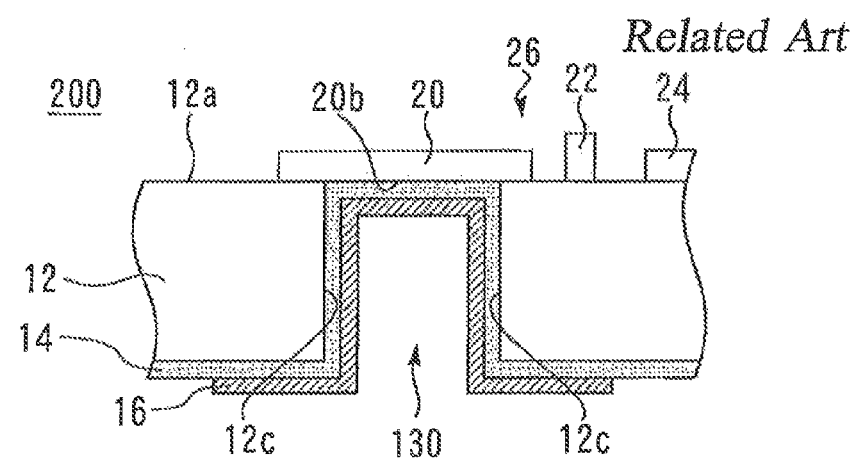
Figure 10:
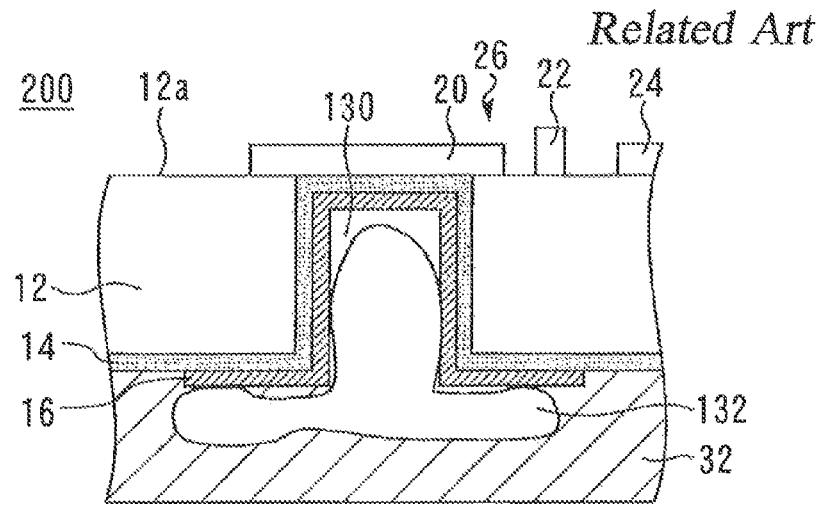

FIG. 10 is a sectional view illustrating a semiconductor device 115 according to a variation of the embodiment of the present invention. The semiconductor device 115 is the same as the semiconductor device 111 except that the Ni layer 16 is replaced by the barrier metal layer 50.

It should be noted that, although the solder layer 32 is omitted in FIGS. 6 to 10 for the purpose of illustration, the semiconductor devices 111, 112, 113, 114, and 115 have the solder layer 32 similarly to the semiconductor device 100.

The features and advantages of the present invention may be summarized as follows. According to the present invention, by providing a second metal layer on a surface of a barrier metal layer in a Via Hole, close contact of a solder is improved while reaction between a first metal layer and the solder is prevented, and thus, occurrence of a void when the solder is provided in the Via Hole can be suppressed.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2013-247862, filed on Nov. 29, 2013, including specification, claims, drawings, and summary, on which the Convention priority of the present application is based, is incorporated herein by reference in its entirety.

What is claimed is:

1. A semiconductor device comprising:
    a semiconductor substrate including a front surface and a back surface;
    a semiconductor element and an electrode of the semiconductor element located on the front surface of the semiconductor substrate;
    an opening on the back surface of the semiconductor substrate and reaching a lower surface of the electrode, wherein
        the opening is defined by a side surface and a bottom surface,
        the bottom surface is located at the lower surface of the electrode, and
        the back surface of the semiconductor substrate and the side surface of the opening join at an edge of the opening;
    a first metal layer covering the side surface of the opening and the bottom surface of the opening;
    a barrier metal layer covering the first metal layer in the opening;
    a second metal layer including a first part inside the opening, covering the barrier metal layer, and located directly opposite the bottom surface of the opening, and a second part outside the opening and covering part of the barrier metal layer at the edge of the opening, opposite the back surface of the semiconductor substrate, wherein the first part of the second metal layer is not in contact with the second part of the second metal layer, and
    solder filling the opening and in contact with the first part of the second metal layer.

2. The semiconductor device according to claim 1, wherein the second metal layer does not cover at least a portion of the barrier metal layer on the side surface of the opening.

3. The semiconductor device according to claim 1, wherein the barrier metal layer is selected from the group consisting of nickel, platinum, lead, titanium, and cobalt.

4. The semiconductor device according to claim 1, wherein the barrier metal layer is an oxide layer of a material selected from the group consisting of nickel, platinum, lead, titanium, and cobalt.

5. The semiconductor device according to claim 1, wherein the barrier metal layer includes:
    a first barrier metal layer, and
    a second barrier metal layer,
    the first barrier metal layer and the second barrier metal layer are laminated on each other at least once,
    the second barrier metal layer has a lower stress than the first barrier metal layer.

6. The semiconductor device according to claim 5, wherein the first barrier metal layer is nickel, and
    the second barrier metal layer is a material selected from the group consisting of platinum, lead, titanium, gold, aluminum, niobium, and copper.

7. The semiconductor device according to claim 5, wherein the first barrier metal layer is thicker than the second barrier metal layer.

8. The semiconductor device according to claim 1, wherein the barrier metal layer extends beyond the edge of the opening and onto the back surface of the semiconductor substrate, from inside the opening, at a periphery of the opening.

9. The semiconductor device according to claim 1, wherein
    the semiconductor element is a transistor including a gate, a source, and a drain located on the front surface of the substrate, and
    the electrode is a source electrode located on the source.

10. The semiconductor device according to claim 1, wherein
    the first metal layer and the second metal layer include gold, and
    the barrier metal layer includes nickel.

11. The semiconductor device according to claim 1, wherein the side surface of the opening is substantially perpendicular to the back surface of the substrate.

* * * * *